（12）United States Patent
Vittu

(10) Patent No.: US 7,084,473 B2
(45) Date of Patent: Aug. 1, 2006

(54) SEMICONDUCTOR PACKAGE WITH AN OPTICAL SENSOR WHICH MAY BE FIT INSIDE AN OBJECT

(75) Inventor: Julien Vittu, Saint Marcellin (FR)

(73) Assignee: STMicroelectronics S.A. (FR)

( * ) Notice: Subject to any disclaimer, the term of this patent is extended or adjusted under 35 U.S.C. 154(b) by 175 days.

(21) Appl. No.: 10/825,077

(22) Filed: Apr. 15, 2004

(65) Prior Publication Data

US 2004/0262704 A1 Dec. 30, 2004

(30) Foreign Application Priority Data

Apr. 29, 2003 (FR) .................................. 03 05265

(51) Int. Cl.
*H01L 31/203* (2006.01)
(52) U.S. Cl. ...................................... 257/433; 257/696
(58) Field of Classification Search ................ 257/433, 257/434, 680, 688, 696, 727, 81, 82
See application file for complete search history.

(56) References Cited

U.S. PATENT DOCUMENTS

| 5,783,815 | A | 7/1998 | Ikeda |
| 5,789,804 | A | 8/1998 | Matsuoka et al. |
| 6,483,101 | B1 | 11/2002 | Webster |
| 6,781,219 | B1 * | 8/2004 | Bissey ........................ 257/666 |
| 2002/0006687 | A1 | 1/2002 | Lam |

| 2003/0038361 | A1 * | 2/2003 | Nakamura .................. 257/696 |
| 2004/0262704 | A1 * | 12/2004 | Vittu .......................... 257/432 |

FOREIGN PATENT DOCUMENTS

| EP | 0 807 976 | 11/1997 |
| EP | 1 220 324 | 7/2002 |
| FR | 2 822 326 | 3/2001 |
| FR | 2 824 955 | 5/2001 |

OTHER PUBLICATIONS

Preliminary French Search Report, FR 03 05265, dated Jan. 14, 2004.

* cited by examiner

*Primary Examiner*—Mark V. Prenty
(74) *Attorney, Agent, or Firm*—Jenkens & Gilchrist, P.C.

(57) ABSTRACT

A semiconductor package includes a package body containing an integrated-circuit chip having an optical sensor. The package can be fitted into an object having two parts suitable for being coupled. A board in the object is provided with electrical connection tracks. The package is placed in a position such that the optical sensor is located facing an opening in the object. The package body carries, on the one hand, resilient rear electrical connection leads that project from a rear face and are electrically connected to the said chip and has, on the other hand, a front bearing surface, such that, when the package body is fitted into the object adjacent the board and when the parts of the object are coupled, the front bearing surface of the body bears on an inner surface of a part of the object and the resilient rear leads bear resiliently on the respective electrical connection tracks of the board.

17 Claims, 3 Drawing Sheets

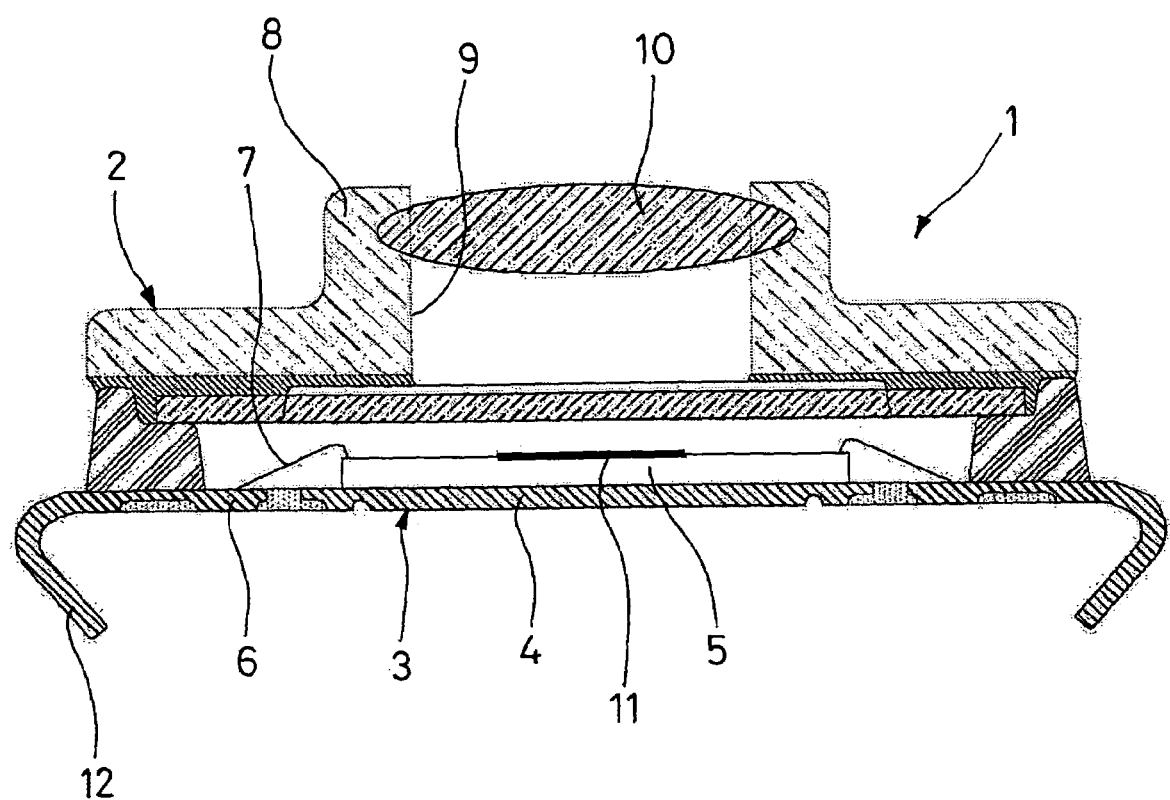
FIG_1

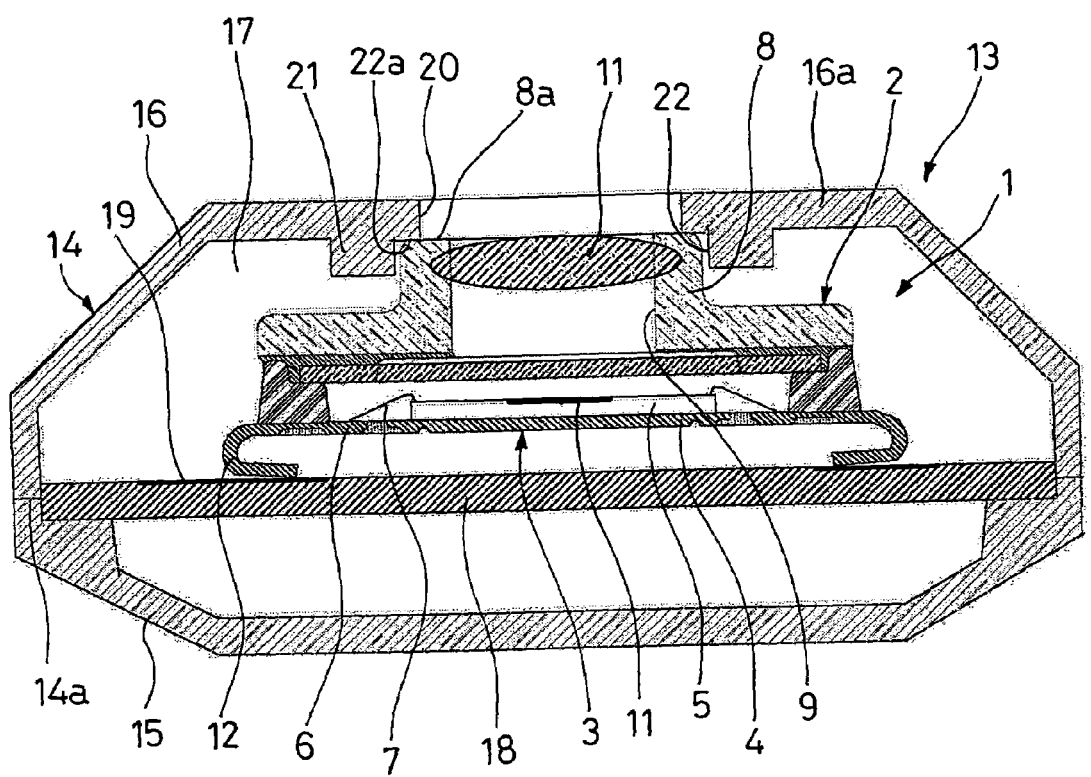
FIG_2

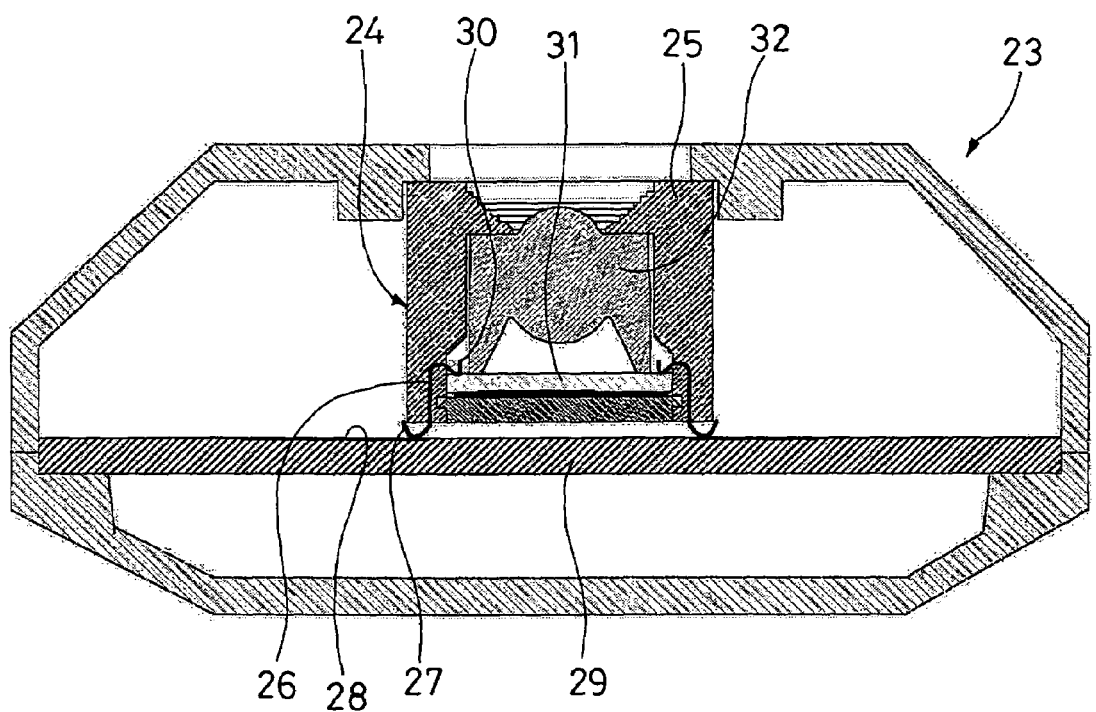
FIG_3

US 7,084,473 B2

SEMICONDUCTOR PACKAGE WITH AN OPTICAL SENSOR WHICH MAY BE FIT INSIDE AN OBJECT

PRIORITY CLAIM

The present application claims priority from French Application for Patent No. 03 05265 filed Apr. 29, 2003, the disclosure of which is hereby incorporated by reference.

BACKGROUND OF THE INVENTION

1. Technical Field of the Invention

The present invention relates to the field of semiconductor packages with optical sensors that are intended to be fitted inside an object, particularly inside a portable telephone.

2. Description of Related Art

At the present time, to fit a semiconductor package with an optical sensor inside the shell of an object, such as a portable telephone, so that this component is electrically connected to tracks of a printed circuit board, an intermediate receptacle provided with electrical connection blades is used. The connection blades have external parts that extend around the periphery of the receptacle and internal parts that extend into the bottom of the latter. The external parts of the said leads of the receptacle are connected by soldering to the tracks of the printed circuit board. The semiconductor package is then engaged in the receptacle so that the internal parts of the connection blades come into contact with contact regions of the rear face of the semiconductor package, the receptacle having branches forming hooks for retaining the semiconductor package. Thus, the semiconductor package is carried by the printed circuit board, independently of the shell of the object.

There is a need in the art to provide a semiconductor package whose structure makes it possible to simplify the operations for fitting the package into an object.

SUMMARY OF THE INVENTION

The semiconductor package according to the invention comprises a package body, containing an integrated circuit semiconductor component having an optical sensor, that can be fitted into an object having two parts suitable for being coupled. In the package, a board is provided with electrical connection tracks. The semiconductor package is placed in a position such that the optical sensor is located facing an opening in the object.

According to the invention, the package body carries, on the one hand, resilient rear electrical connection leads that project from its rear face and are electrically connected to the semiconductor component. On the other hand, the package body has a front bearing surface opposite the rear face, such that, when the package body is fitted into the object and when the parts of this object are coupled, the front bearing surface of the said body bears on an inner surface of a part of the object and the resilient rear leads bear resiliently on the respective electrical connection tracks of the board.

According to the invention, the package body and the object have respective positioning surfaces that are perpendicular to the bearing surfaces.

According to the invention, the object preferably has an internal housing for housing part of the package body.

According to the invention, the resilient rear leads are curved.

According to the invention, the optical sensor is preferably located on the opposite side from the resilient rear leads.

According to the invention, the aforementioned internal surface of the object extends around the aforementioned opening in the latter.

BRIEF DESCRIPTION OF THE DRAWINGS

A more complete understanding of the method and apparatus of the present invention may be acquired by reference to the following Detailed Description when taken in conjunction with the accompanying Drawings wherein:

FIG. 1 is shows, in cross section, a semiconductor package with an optical sensor according to the invention;

FIG. 2 shows a cross section of an object into which the semiconductor package of FIG. 1 has been fitted; and FIG. 3 shows, in cross section, another semiconductor package with an optical sensor according to the present invention, fitted inside an object.

DETAILED DESCRIPTION OF THE DRAWINGS

FIG. 1 shows a semiconductor package 1 that comprises a package body 2, the rear wall of which is provided with a metal leadframe 3 having a central platform 4 to the front face of which an integrated circuit chip 5 is fastened, for example by adhesive bonding. The leadframe has a multiplicity of electrical connection leads 6 extending around the periphery of the platform 4 and spaced apart peripherally, these leads 6 being connected to the chip 5 via electrical connection wires 7 inside the body 2.

The front wall of the package body 2 has a central part 8 projecting towards the front, provided through which central part is a front opening 9 into which an optical lens 10, located in front of and at a certain distance from an integrated optical sensor 11, is fitted, the optical sensor being provided on the surface of the front face of the chip 5.

The electrical connection leads 6 have, beyond the periphery of the package body 2, free terminal parts 12 which are bent or curved towards the rear and beneath the package body 2 in the manner of a pin head. These terminal parts 12 thus project beyond the rear face of the package body 2.

FIG. 2 shows an object 13 that comprises a shell 14 made in two parts 15 and 16 that define between them a cavity 17. These two parts are joined along a mating plane 14a and coupled or fastened to each other by any known means, for example by adhesive bonding, by welding or by catching tabs.

Fitted into the cavity 17 of the shell 14 is a printed circuit board 18 that extends approximately in the mating plane 14a of the said parts 15 and 16. This board 18 has on its front face, on the same side as the part 16, electrical connection tracks 19.

The wall of the part 16 of the shell 14 has a region 16a that extends parallel to the printed circuit board 18. An opening 20 is provided through the region 16a. This region 16a has, on its inner face, a projecting shoulder 21 surrounding, at a certain distance from, the opening 20 and defining a housing 22.

The semiconductor package 1 is fitted into the cavity 17 of the shell 14 of the object 13, between the region 16a of its part 16 and the board 18, in a position such that the front surface 8a of its projecting part 8 bears on the internal surface 22a of the region 16a, in the top of the housing 22 and in such a way that the rear terminal parts 12 of the electrical connection leads bear respectively, in a resilient manner, on tracks 19 of the printed circuit board 18, the lens 10 thus facing the opening 20.

The arrangement shown in FIG. 2 may be obtained in the following manner.

The part 15 of the shell 14, the printed circuit board 18, the semiconductor package 1 and the part 16 of the shell 14 are stacked. With no pressure, the parts 15 and 16 of the shell 14 have a gap between them.

Next, the parts 15 and 16 of the shell 14 are brought together so that they come into contact along the mating plane 14a. Having done this, the curved terminal parts 12 of the electrical connection leads 6 of the semiconductor package 1 are elastically deformed, making them even more curved. Next, the parts 15 and 16 of the shell 14 are coupled and fastened together, as indicated previously.

The result of the foregoing is that the semiconductor package 1, in a single assembly operation, is fitted and held in place in the shell 14 axially by means of a resilient effect of the terminal parts 12 of the electrical connection leads in the perpendicular to its front and rear bearing surfaces by means of the positioning surfaces determined by the shoulder 21 that delimits the housing 22 and the part 8 of the package 1, the chip 5 that it contains being at the same time connected to the electrical connection tracks 19 of the printed circuit board 18. Of course, these tracks are connected to other components carried on or connected to the board 18.

FIG. 3 shows an object 23 corresponding to the object 13 of FIG. 2, into which a semiconductor package 24 has been fitted in the same manner.

This semiconductor package 24 differs from the semiconductor package 1 by the fact that its package body 25 carries transverse electrical connection leads 26 which have curved rear terminal parts 27 coming into contact with electrical connection tracks 28 provided on the front face of a printed circuit board 29 and inner terminal parts 30 that bear in a resilient manner directly on pads of a printed circuit chip 31 having an optical sensor located to the rear of an optical lens 32.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A semiconductor package comprising:
a package body, containing an integrated-circuit chip having an optical sensor, that can be fitted into an object having two parts suitable for being coupled, and in which package a board provided with electrical connection tracks is placed in a position such that the optical sensor is located facing an opening in this object;
wherein the said package body carries, on the one hand, resilient rear electrical connection leads that project from its rear face and are electrically connected to the said chip and has, on the other hand, a front bearing surface such that, when the said package body is fitted into the said object and when the said parts of this object are coupled, the front bearing surface of the said body bears on an inner surface of a part of the object and the said resilient rear leads bear resiliently on the respective electrical connection tracks of the board.

2. The package according to claim 1, wherein the said package body and the object have respective positioning surfaces that are perpendicular to the said bearing surfaces.

3. The package according to claim 1, wherein the object has an internal housing for housing part of the package body.

4. The package according to claim 1, wherein the resilient rear electrical connection leads are curved.

5. The package according to claim 1, wherein the optical sensor is located on an opposite side from the said resilient rear electrical connection leads.

6. The package according to claim 1, wherein the internal surface of the object extends around the aforementioned opening.

7. A product, comprising:
a first cover;
a printed circuit board associated with the first cover;
a semiconductor package having a first surface and a second surface, the package including a plurality of resilient electrical connection leads extending from the first surface, the semiconductor package positioned with its first surface adjacent the printed circuit board; and
a second cover mating with the first cover to define a cavity enclosing the printed circuit board and the semiconductor package, the mating of the second cover to the first cover exerting pressure against the second surface of the semiconductor package and causing the resilient electrical connection leads to bear resiliently on the printed circuit board.

8. The product as in claim 7, wherein the second cover has an internal housing for housing part of the semiconductor package.

9. The product as in claim 7, wherein the resilient electrical connection leads are curved.

10. The product as in claim 7 wherein the semiconductor package includes an optical sensor assembly associated with the second surface and wherein the second cover includes an aperture therein aligned with the optical sensor assembly when the second cover is mated with the first cover.

11. A product, comprising:
a split enclosure that mates together;
a printed circuit board located within the enclosure;
a semiconductor package also located within the enclosure, the package including a plurality of resilient electrical connection leads extending therefrom and positioned in contact with the printed circuit board, the leads being resiliently deformed in response to pressure exerted by mating of the split enclosure on opposite sides of the semiconductor package and printed circuit board.

12. The product as in claim 11, wherein the second cover has an internal housing for housing part of the semiconductor package.

13. The product as in claim 11, wherein the resilient electrical connection leads are curved.

14. The product as in claim 11 wherein the semiconductor package includes an optical sensor assembly and wherein the split enclosure includes an aperture therein aligned with the optical sensor assembly when the split enclosure is mated.

15. A semiconductor package comprising:
an integrated circuit chip including an optical sensor;
a metal leadframe to which the integrated circuit chip is attached, the metal leadframe including a plurality of electrical connection leads made of a pressure deformable resilient material;

a package including an aperture aligned with the optical sensor and encapsulating the integrated circuit chip and metal leadframe, the plurality of electrical connection leads extending therefrom in a curved shape under a bottom surface thereof.

16. A semiconductor package, comprising:

an integrated circuit chip;

a plurality of electrical connection leads made of a pressure deformable resilient material, each lead having a first and second end; and a package enclosing the integrated circuit chip and through which a central portion of each lead passes, the package causing the first end of each lead to resiliently contact a surface of the integrated circuit chip and the second end of each lead extending from the package in a curved shape under a bottom surface thereof.

17. The package of claim 16 wherein the integrated circuit chip includes an optical sensor and the package includes an aperture aligned with the optical sensor.

* * * * *